(12) United States Patent
Yang

(10) Patent No.: US 6,727,554 B1
(45) Date of Patent: Apr. 27, 2004

(54) ESD PROTECTION CIRCUIT AND METHOD FOR FABRICATING THE SAME

(75) Inventor: Hae Chang Yang, Chungcheongbuk-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/452,809

(22) Filed: Dec. 2, 1999

(30) Foreign Application Priority Data

Mar. 18, 1999 (KR) ............................................ 1999/9231

(51) Int. Cl.⁷ .............................................. H01L 36/62
(52) U.S. Cl. ....................................................... 257/355
(58) Field of Search ................................ 257/355, 364, 257/356, 357, 358, 359, 360, 361, 362, 363, 365, 110, 354; 361/111, 54, 56, 91, 58, 126, 127; 327/525, 478, 577, 378, 379, 309, 362, 432

(56) References Cited

U.S. PATENT DOCUMENTS

| | | | |
|---|---|---|---|
| 5,157,573 A | * 10/1992 | Lee et al. ...................... | 361/56 |
| 5,594,266 A | * 1/1997 | Beigel et al. ................ | 257/355 |
| 5,617,283 A | 4/1997 | Krakauer et al. | |
| 5,640,299 A | * 6/1997 | Leach .......................... | 361/56 |
| 5,674,761 A | 10/1997 | Chang et al. | |
| 5,708,550 A | 1/1998 | Avery | |
| 5,821,587 A | * 10/1998 | Jeong | |
| RE36,024 E | * 1/1999 | Ho et al. ...................... | 257/356 |
| 6,246,079 B1 | * 6/2001 | Chen ........................... | 257/173 |
| 6,268,992 B1 | * 7/2001 | Lee et al. ..................... | 362/111 |

FOREIGN PATENT DOCUMENTS

JP    404159773 A   *  6/1992

OTHER PUBLICATIONS

William H. Hayt, Jr., Engineering Electromagnetics 1989, McGraw–Hill, Inc., Fifth Edition, p. 121.*

* cited by examiner

Primary Examiner—Long Pham
Assistant Examiner—Dana Farahani
(74) Attorney, Agent, or Firm—Birch, Stewart, Kolasch & Birch, LLP

(57) ABSTRACT

ESD protection circuit and method for fabricating the same, which has an improved performance, the method including the steps of (1) forming a transistor on a substrate, (2) forming a first insulating film on the substrate inclusive of the transistor and having a first contact hole to an input terminal of the transistor, (3) forming a buffered layer in the first contact hole and the first insulating film in the vicinity of the first contact hole, (4) forming a second insulating film on the first insulating film inclusive of the buffered layer and having a second contact hole to the buffered layer, and (5) forming a pad both on the second contact hole and the second insulating film in the vicinity of the second contact hole.

4 Claims, 5 Drawing Sheets

ESD PROTECTION CIRCUIT AND METHOD FOR FABRICATING THE SAME

BACKGROUND OF THE INVENTION

1. Field of the Invention

The present invention relates to an ESD(Electro-Static Discharge) protection circuit, and more particularly, to an ESD protection circuit and a method for fabricating the same, which has an improved performance.

2. Background of the Related Art

FIG. 1 illustrates a system of a related art ESD protection circuit. In general, a maximum field strength against which an oxide film in an MOS transistor can endure is 6 MV/cm, which corresponds to 30V if the oxide film is scaled up to a thickness of 50 nm. A voltage of this magnitude can be easily generated from minute static electricity occurring around a circuit. There is continuous generation of static electricity when a human body makes movement, and the human body acts as a carrier that carries a great amount of charge. Therefore, if the human body comes close to a conductor, the static electricity is discharged, causing a great amount of current to flow within a short time. Thus, as the amount of charge required to damage a transistor is very small, an ESD protection circuit 2 is provided to an input pin between a pad 1 and a main chip 3 so that the static electricity, rushing into an inner part of the main chip 3, is discharged through an appropriate circuit for maintaining voltages on an input terminal and an output terminal within fixed ranges. Thus, an input protection circuit and an output protection circuit are required for prevention of static breakdown.

A related art ESD protection circuit will be explained with reference to the attached drawings. FIG. 2 illustrates a first exemplary related art ESD protection circuit, and FIG. 3 illustrates a second exemplary related art ESD protection circuit.

Referring to FIG. 2, the first exemplary related art ESD protection circuit is provided with a plurality of first transistors 11 each having a collector connected to an input pin between a pad 1 and a main chip 3, and a gate and an emitter both grounded, wherein a voltage from the pad 1 is provided to the main chip 3 directly in a regular case and an inflow of a static electricity is bypassed to the transistors 11, thereby protecting the main chip 3.

Referring to FIG. 3, the second exemplary related art ESD protection circuit is provided with a plurality of second transistors 12 each having a collector connected to an input pin between a pad 1 and a main chip 3 through a first resistor 13, a gate grounded, and an emitter grounded through a second resistor 14, wherein a voltage from the pad 1 is provided to the main chip 3 directly in a regular case and an inflow of static electricity is bypassed to the transistors 12, thereby protecting the main chip 3.

However, the related art ESD protection circuits and methods for fabricating the same have the following problems.

First, the related art ESD protection circuit, having the plurality of transistors each with the collector connected to the input pin between the pad and the main chip and the gate and the emitter both grounded, i.e., no resistor is connected to the emitter/collector, may be subject to breakage at a particular point caused by momentary concentration of a charge on the particular point in a case of a BJT of single or plural units or in case the static electricity is generated from inside, and a space of the ESD protection circuit for preventing such an occurrence requires a larger area.

Second, the related art ESD protection circuit, having the plurality of transistors each with the collector connected to the input pin between the pad and the main chip through the first resistor, the gate grounded, and the emitter grounded through the second resistor, is involved in reduction of BJT gain caused by the two resistors connected to the emitter/collector and a drop of an ESD capability.

SUMMARY OF THE INVENTION

Accordingly, the present invention is directed to an ESD protection circuit and a method for fabricating the same that substantially obviates one or more of the problems due to limitations and disadvantages of the related art.

An object of the present invention is to provide an ESD protection circuit and a method for fabricating the same, which has an improved performance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the ESD protection circuit includes a substrate, a transistor formed on the substrate, a first insulating film formed on the substrate inclusive of the transistor and having a first contact hole to an input terminal of transistor, a buffered layer formed on the first insulating film inclusive of the first contact hole and electrically connected to the input terminal for acting as a resistor, a second insulating film formed on the first insulating film inclusive of the buffered layer and having a second contact hole to the buffered layer, and a pad formed on the second insulating film inclusive of the second contact hole and electrically connected to the buffered layer.

In another aspect of the present invention, there is provided a method for fabricating an ESD protection circuit, including the steps of (1) forming a transistor on a substrate, (2) forming a first insulating film on the substrate inclusive of the transistor and having a first contact hole to an input terminal of the transistor, (3) forming a buffered layer in the first contact hole and the first insulating film in the vicinity of the first contact hole, (4) forming a second insulating film on the first insulating film inclusive of the buffered layer and having a second contact hole to the buffered layer, and (5) forming a pad both on the second contact hole and the second insulating film in the vicinity of the second contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
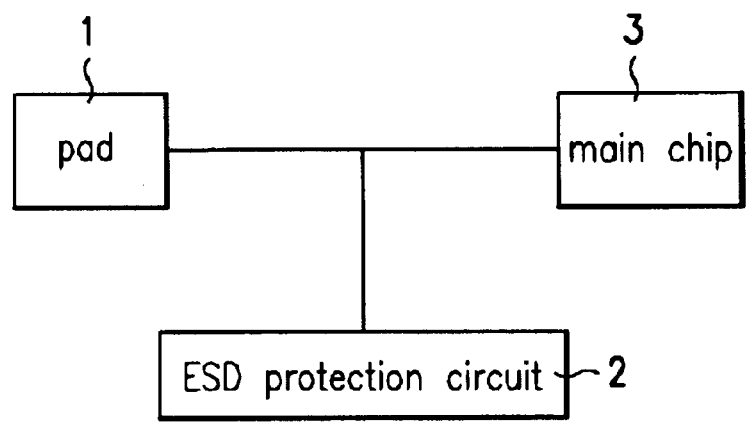
FIG. 1 illustrates a system of a related art ESD protection circuit.
Figure 2:
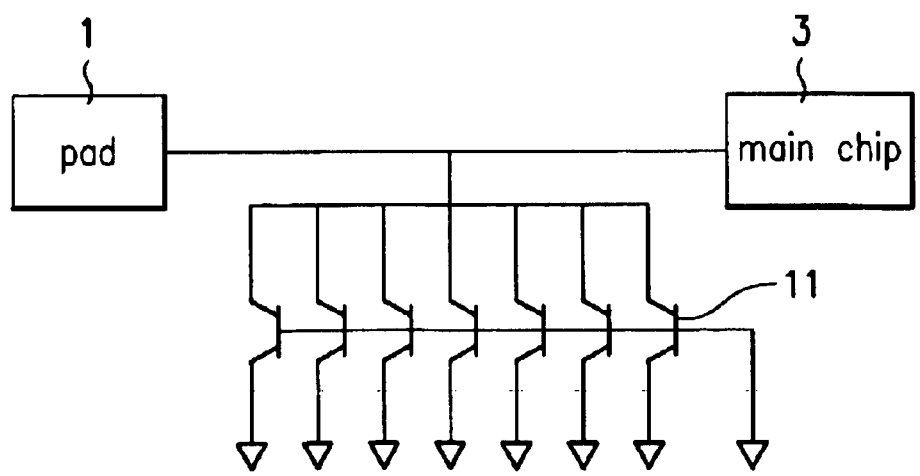
FIG. 2 illustrates a first exemplary related art ESD protection circuit.
Figure 3:
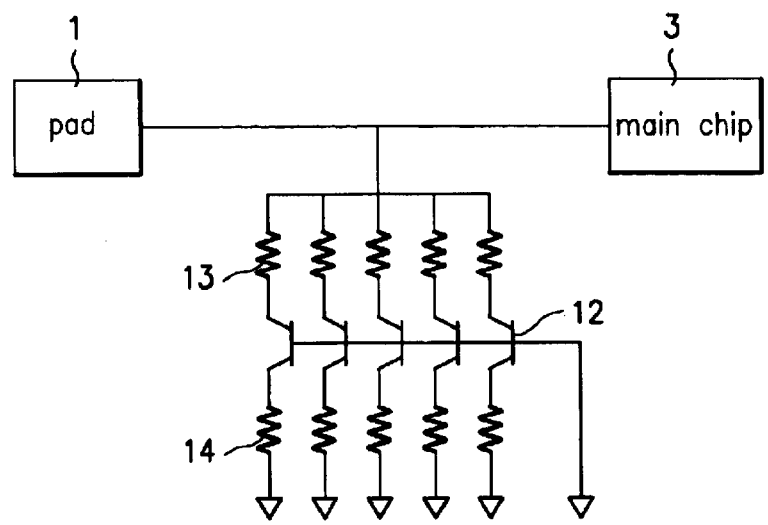
FIG. 3 illustrates a second exemplary related art ESD protection circuit.
Figure 4:
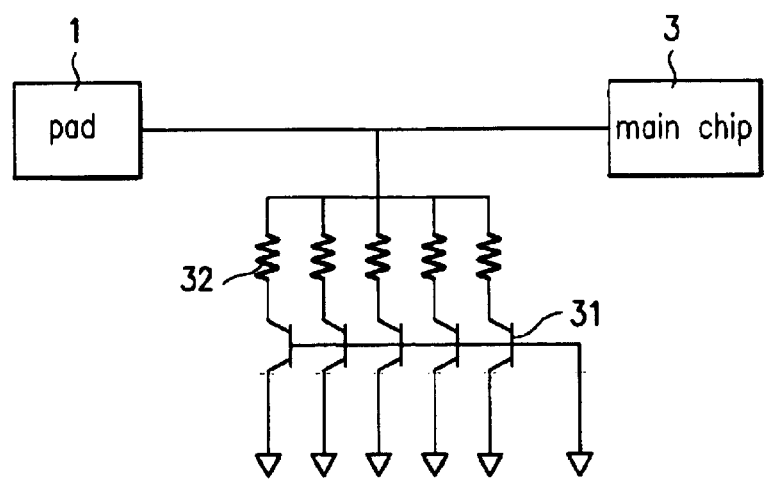
FIG. 4 illustrates an ESD protection circuit in accordance with a preferred embodiment of the present invention.

Reference will now be made in detail to the preferred embodiments of the present invention, examples of which are illustrated in the accompanying drawings. FIG. 4 illustrates an ESD protection circuit in accordance with a preferred embodiment of the present invention, FIG. 5 illustrates a section of an ESD protection circuit in accordance with a preferred embodiment of the present invention, and FIGS. 6a~6c illustrates sections showing the steps of a method for fabricating an ESD protection circuit in accordance with a preferred embodiment of the present invention.

Referring to FIG. 4, the ESD protection circuit in accordance with a preferred embodiment of the present invention includes a plurality of transistors 31 each having a collector connected to an input pin between a pad 1 and a main chip 3 through a resistor 32 and a gate and a emitter both grounded, wherein a voltage from the pad 1 is provided to the main chip 3 directly in a regular case and an inflow of a static electricity is bypassed to the second transistors 31, thereby protecting the main chip 3.

The ESD protection circuit of the present invention may be fabricated utilizing an NMOS transistor fabricating method, to have the following structure.

Figure 5:
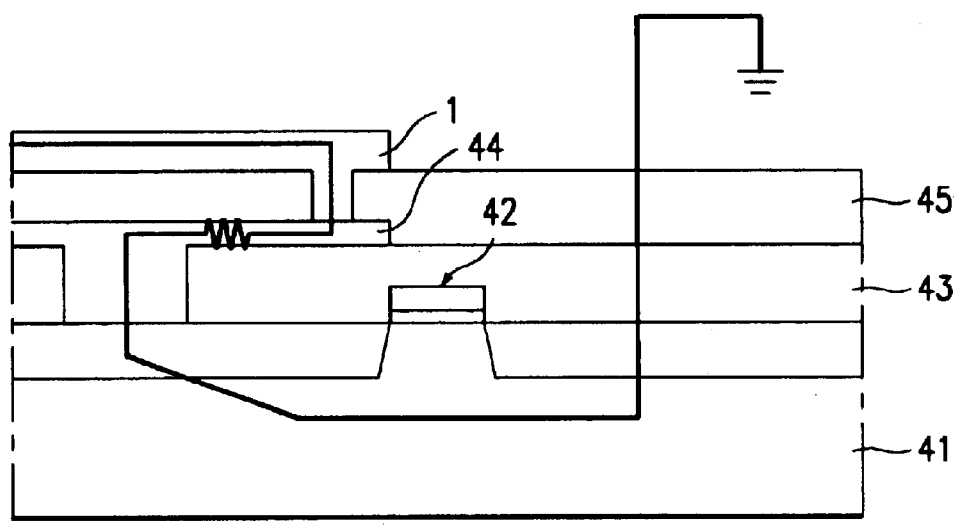
FIG. 5 illustrates a section of ESD protection circuit in accordance with a preferred embodiment of the present invention; and, FIGS. 6a~6c illustrates sections showing the steps of a method for fabricating an ESD protection circuit in accordance with a preferred embodiment of the present invention.
Figure 6A:
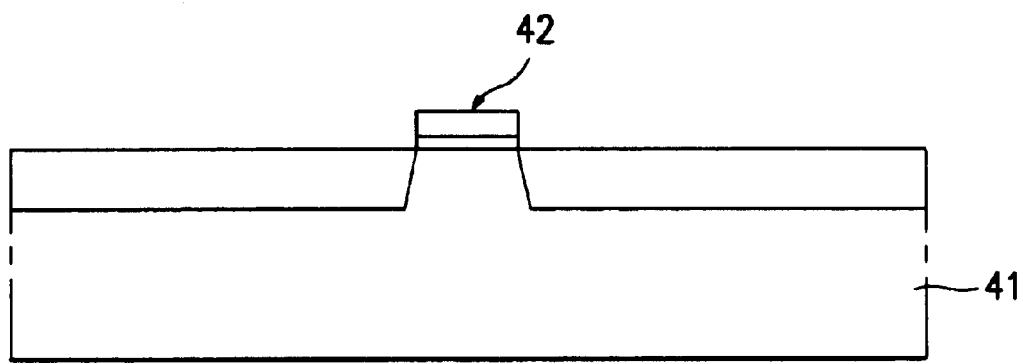
Figure 6B:
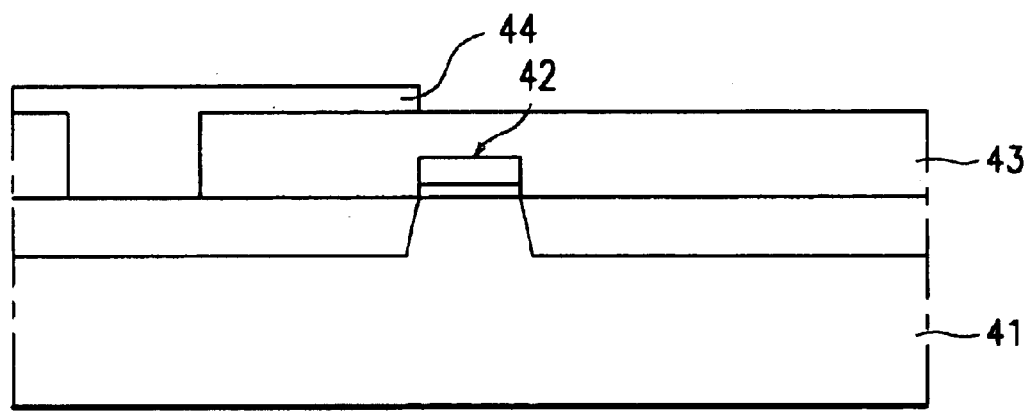
Figure 6C:
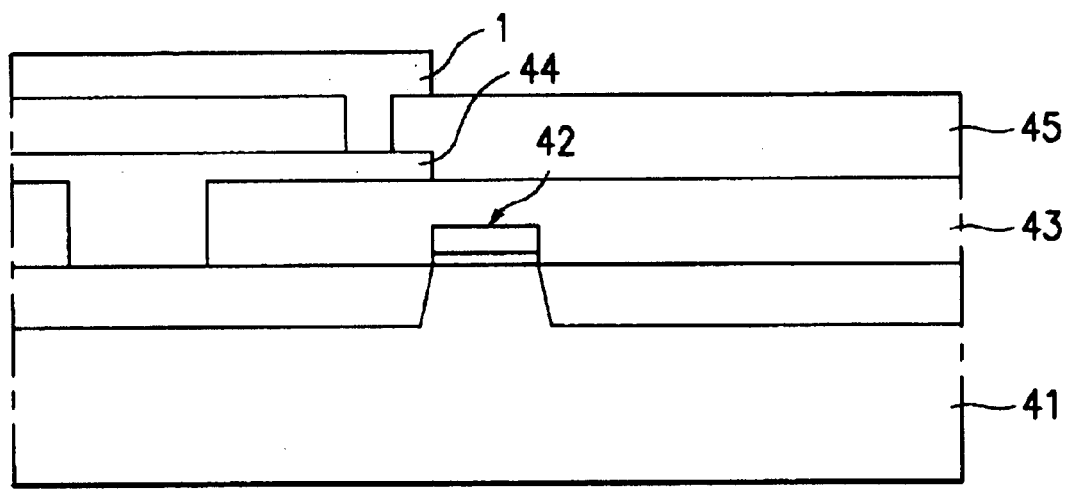

Referring to FIG. 5, the ESD protection circuit of the present invention includes an NMOS transistor 42 formed on a semiconductor substrate 41, a first ILD (InterLayer Dielectric) layer 43 formed on the semiconductor substrate 41 inclusive of the NMOS transistor 42 and having a first contact hole to a drain of the NMOS transistor 42, a buffered layer 44 formed on the ILD layer 43 inclusive of the first contact hole and electrically connected to the drain for acting as a resistor, a second ILD layer 45 formed on the first ILD layer 43 inclusive of the buffered layer 44 and having a second contact hole to the buffered layer 44, and a pad 1 formed on the second ILD layer 45 inclusive of the second contact hole and electrically connected to the buffered layer 44, for discharging static electricity through the pad 1, the buffered layer 44, the drain of the NMOS transistor 42, and the source of the NMOS transistor 42.

A method for fabricating an ESD protection circuit in accordance with a preferred embodiment of the present invention will be explained with reference to FIGS. 6a~6c.

Referring to FIG. 6a, the method for fabricating an ESD protection circuit in accordance with a preferred embodiment of the present invention starts with forming an NMOS transistor 42 on a semiconductor substrate 41. As shown in FIG. 6b, a first ILD layer 42 and a first photoresist film are formed on the semiconductor substrate 41 inclusive of the NMOS transistor 43, and subjected to selective exposure and development to remove only a portion of the first photoresist film in which a first contact hole to a drain of the NMOS transistor 42 is to be formed. The selectively exposed and developed first photoresist film is used as a mask in etching the first ILD layer selectively, to form a first contact hole, and, then, the first photoresist film is removed. Polysilicon and a second photoresist film are formed on the first ILD layer 43 inclusive of the first contact hole, and the second photoresist film is subjected to selective exposure and development to leave the second photoresist film only on a region on which a buffered layer is to be formed. In this instance, instead of the polysilicon, a silicide may be used. The selectively exposed and developed second photoresist film is used as a mask in etching the polysilicon selectively, to form a buffered layer 44, and, then, the second photoresist film is removed. As shown in FIG. 6c, a second ILD layer 45 and a third photoresist film are formed on the first ILD layer 43 inclusive of the buffered layer 44, and the third photoresist film is subjected to selective exposure and development to remove a portion of the third photoresist film in which a second contact hole to the buffered layer 44 is to be formed. The selectively exposed and developed third photoresist film is used as a mask in selective etching of the second ILD layer 45, to form a second contact hole, and, then, the third photoresist film is removed. Then, a pad 1 is formed on the second ILD layer 45 inclusive of the second contact hole.

Because the ESD protection circuit of the present invention has a plurality of transistors each with a collector only connected to an input terminal through a resistor, connected to an input pin between a pad and a main chip, and a gate and an emitter both grounded, the ESD protection circuit and the method for fabricating the same is favorable for use in a fast speed device which should have a small input capacitor, because the resistor at the input terminal increases a secondary breakdown voltage and distributes static electricity so as not to concentrate on a particular point, the particular point breakage can be prevented, and because the ESD protection circuit of the present invention has a BJT gain greater than the related art ESD protection circuit having resistors connected both to the emitter/the collector, an ESD protection capability is improved.

It will be apparent to those skilled in the art that various modifications and variations can be made in the ESD protection circuit and the method for fabricating the same of the present invention without departing from the spirit or scope of the invention. Thus, it is intended that the present invention cover the modifications and variations of this invention provided they come within the scope of the appended claims and their equivalents.

What is claimed is:

1. An ESD protection circuit comprising:
   a substrate;
   a transistor formed on the substrate;
   a first insulating film formed on the substrate inclusive of the transistor and having a first contact hole to an input terminal of transistor;
   a buffered layer formed on the first insulating film inclusive of the first contact hole and electrically connected to the input terminal for acting as a resistor;
   a second insulating film formed on the first insulating film inclusive of the buffered layer and having a second contact hole to the buffered layer; and,
   a pad formed on the second insulating film inclusive of the second contact hole and electrically connected to the buffered layer, for discharging static electricity from said pad, through the buffered layer, and through said transistor to ground.

2. A method for fabricating an ESD protection circuit, comprising the steps of:

(1) forming a transistor on a substrate;

(2) forming a first insulating film on the substrate inclusive of the transistor and having a first contact hole to an input terminal of the transistor;

(3) forming a buffered layer in the first contact hole and the first insulating film in the vicinity of the first contact hole;

(4) forming a second insulating film on the first insulating film inclusive of the buffered layer and having a second contact hole to the buffered layer; and, (5) forming a pad both on the second contact hole and the second insulating film in the vicinity of the second contact hole, for discharging static electricity from said pad, through the buffered layer, and through said transistor to ground.

3. A method as claimed in claim 2, wherein the buffered layer is formed of polysilicon.

4. A method as claimed in claim 2, wherein the buffered layer is formed of a silicide.

* * * * *